United States Patent
Amstatt et al.

(10) Patent No.: US 10,651,341 B2
(45) Date of Patent: May 12, 2020

(54) OPTOELECTRONIC DEVICE AND METHOD FOR MANUFACTURING SAME

(71) Applicants: Aledia, Grenoble (FR); Centre National de la Recherche Scientifique, Paris (FR)

(72) Inventors: Benoît Amstatt, Grenoble (FR); Sylvia Scaringella, Eybens (FR); Jesus Zuniga-Perez, Biot (FR)

(73) Assignees: Aledia, Grenoble (FR); Centre National de la Recherche Scientifique, Paris (FR)

(*) Notice: Subject to any disclaimer, the term of this patent is extended or adjusted under 35 U.S.C. 154(b) by 0 days.

(21) Appl. No.: 16/538,437

(22) Filed: Aug. 12, 2019

(65) Prior Publication Data

US 2019/0363219 A1    Nov. 28, 2019

Related U.S. Application Data

(62) Division of application No. 15/541,682, filed as application No. PCT/FR2016/050111 on Jan. 20, 2016, now Pat. No. 10,424,692.

(30) Foreign Application Priority Data

Jan. 22, 2015 (FR) ...................... 15 50511

(51) Int. Cl.
*H01L 33/18* (2010.01)
*H01L 33/08* (2010.01)
(Continued)

(52) U.S. Cl.
CPC .......... *H01L 33/18* (2013.01); *H01L 31/0264* (2013.01); *H01L 31/035227* (2013.01);
(Continued)

(58) Field of Classification Search
None
See application file for complete search history.

(56) References Cited

U.S. PATENT DOCUMENTS

2004/0089861 A1* 5/2004 Chen ................. H01L 33/145
257/11
2006/0257626 A1* 11/2006 Schlesser ............... C30B 25/02
428/141
(Continued)

FOREIGN PATENT DOCUMENTS

EP    2 390 930 A2    11/2011

OTHER PUBLICATIONS

U.S. Appl. No. 15/541,682, filed Jul. 5, 2017, Amstatt et al.
(Continued)

*Primary Examiner* — Daniel Whalen
(74) *Attorney, Agent, or Firm* — Wolf, Greenfield & Sacks, P.C.

(57) ABSTRACT

An optoelectronic device including first and second active regions suitable for emitting or detecting electromagnetic radiation and containing a first semiconductor material that predominantly contains a first compound selected from Compounds III-V, Compounds II-VI, and mixtures of same. The first active regions have a first polarity, and the second active regions have a second polarity different from the first polarity.

11 Claims, 5 Drawing Sheets

(51) Int. Cl.
*H01L 33/24* (2010.01)
*H01L 33/26* (2010.01)
*H01L 31/0352* (2006.01)
*H01L 31/0264* (2006.01)

(52) U.S. Cl.
CPC ...... *H01L 31/035281* (2013.01); *H01L 33/08* (2013.01); *H01L 33/24* (2013.01); *H01L 33/26* (2013.01); *Y02E 10/50* (2013.01)

(56) References Cited

U.S. PATENT DOCUMENTS

| | | |
|---|---|---|
| 2008/0006831 A1 | 1/2008 | Ng |
| 2014/0077151 A1 | 3/2014 | Pougeoise et al. |
| 2014/0363912 A1* | 12/2014 | Ohlsson ............ H01L 33/0062 438/35 |
| 2018/0277717 A1 | 9/2018 | Amstatt et al. |

OTHER PUBLICATIONS

International Search Report and Written Opinion for Application No. PCT/FR2016/050111, dated Mar. 16, 2016.
Carnevale et al., Mixed polarity in polarization-induced p-n junction nanowire light-emitting diodes. Nano Letters. 2013;13(7):3029-35.
Li et al., Interactions between inversion domains and InGaN/GaN multiple quantum wells investigated by transmission electron microscopy. Journal of Crystal Growth. 2003;(247):28-34.
Li et al., Nitrogen-polar core-shell GaN light-emitting diodes grown by selective area metalorganic vapor phase epitaxy. Applied Physics Letters. 2012;(101)032103:1-4.
Mandl et al., Group III nitride core-shell nano- and microrods for optoelectronic applications. Physica Status Solidi (RRL)-Rapid Research Letters. 2013;7(10):800-14.

* cited by examiner

OPTOELECTRONIC DEVICE AND METHOD FOR MANUFACTURING SAME

This application is a Division of U.S. application Ser. No. 15/541,682, filed Jul. 5, 2017, which is the national phase of International Application No PCT/FR2016/050111, filed on Jan. 20, 2016, which claims priority to French Patent Application No. 15/50511, filed on Jan. 22, 2015. The entire contents of these applications are incorporated herein by reference in their entireties.

BACKGROUND

The present invention generally relates to optoelectronic devices made up of semiconductor materials and to methods of manufacturing the same.

Term "optoelectronic devices" is used to designate devices capable of converting an electric signal into an electromagnetic radiation or the other way, and especially devices dedicated to detecting, measuring, or emitting an electromagnetic radiation, or devices dedicated to photovoltaic applications.

DISCUSSION OF THE RELATED ART

The region from which most of the electromagnetic radiation supplied by the optoelectronic device is emitted or where most of the electromagnetic radiation received by the optoelectronic device is received is called active region of an optoelectronic device.

The optoelectronic device is said to have a two-dimensional structure when the active region is formed of a planar semiconductor layer and the optoelectronic device is said to have a three-dimensional structure when the active region or the active regions are formed on three-dimensional semiconductor elements, for example, microwires or nanowires.

It is known to form an active region comprising a single quantum well or multiple quantum wells. A single quantum well is formed by interposing, between two layers of a first semiconductor material, for example, a III-V compound, particularly GaN, respectively P- and N-type doped, a layer of a second semiconductor material, for example, an alloy of the III-V or II-VI compound and of a third element having a different bandgap than the first doped material. The third element is for example indium (In) and the second semiconductor material may be InGaN. A multiple quantum well structure comprises a stack of semiconductor layers forming an alternation of quantum wells and of barrier layers.

An optoelectronic device having a two-dimensional or three-dimensional structure generally emits a substantially monochromatic radiation having its wavelength depending on the properties of the active region, and particularly of the first and second semiconductor materials.

It may be desirable to form an optoelectronic device having a wide spectrum of emission or reception wavelengths. In the case of an optoelectronic device emitting an electromagnetic radiation, it is known to cover the optoelectronic, device with a layer of light-emitting materials to convert at least part of the radiation emitted by the active region of the optoelectronic device into a radiation at another wavelength. However, the use of light-emitting materials increases the cost of the optoelectronic device and does not always enable to obtain the desired emission spectrum.

It would however be desirable to have an optoelectronic device comprising at least two different active regions capable of emitting or of receiving a radiation at at least two different wavelengths.

SUMMARY

Thus, an object of an embodiment is to overcome at least part of the disadvantages of the previously-described optoelectronic devices and of their manufacturing methods.

Another object of an embodiment is to widen the emission or absorption spectrum of the optoelectronic device.

Another object of an embodiment is to be able to form the optoelectronic device at an industrial scale and at a low cost.

Thus, an embodiment provides an optoelectronic device comprising first and second active regions capable of emitting or receiving an electromagnetic radiation and comprising at least one first semiconductor material mainly comprising a first compound selected from III-V compounds, II-VI compounds, and mixtures thereof, the first active regions having a first polarity and the second active regions having a second polarity different from the first polarity.

According to an embodiment, the first active regions are capable of emitting or of receiving a first electromagnetic radiation at a first wavelength and the second active regions are capable of emitting or of receiving a second electromagnetic radiation at a second wavelength different from the first wavelength.

According to an embodiment, the first polarity corresponds to the polarity of the group-III or -II element and the second polarity corresponds to the polarity of the group-V or -VI element.

According to an embodiment, the device comprises:
a substrate;
first semiconductor portions resting on the substrate, made of a second semiconductor material mainly comprising the first compound, and having the first polarity, the first active regions being in contact with the first semiconductor portions; and
second semiconductor portions resting on the substrate, made of the second semiconductor material, and having the second polarity, the second active regions being in contact with the second semiconductor portions.

According to an embodiment, the first semiconductor material comprises a further element in addition to the first compound.

According to an embodiment, the device further comprises:
third portions of a third semiconductor material, having a third polarity and located between the substrate and the first semiconductor portions, the third material being a nitride, a carbide, or a boride of a transition metal from column IV, V, or VI, or a combination of these compounds; and
fourth portions of the third semiconductor material, having a fourth polarity different from the third polarity, and located between the substrate and the second semiconductor portions.

According to an embodiment, the first semiconductor portions are pyramid-shaped and the second semiconductor portions comprise microwires or nanowires.

An embodiment also aims at a method of manufacturing an optoelectronic device comprising the forming of first and second active regions capable of emitting or receiving an electromagnetic radiation made of at least a first semiconductor material mainly comprising a first compound selected from III-V compounds, II-VI compounds, and mixtures thereof, the first active regions having a first polarity and the second active regions having a second polarity different from the first polarity.

According to an embodiment, the method comprises the steps of:

forming on a substrate first semiconductor portions of a second semiconductor material mainly comprising the first compound and having the first polarity and second semiconductor portions of the second semiconductor material having the second polarity; and growing by simultaneous epitaxy the first active regions in contact with the first semiconductor portions and the second active regions in contact with the second semiconductor portions.

According to an embodiment, the method further comprises the steps of:

forming, on the substrate, third portions of a third semiconductor material having a third polarity and fourth portions of the third semiconductor material having a fourth polarity different from the third polarity, the third material being a nitride, a carbide, or a boride of a transition metal from column IV, V, or VI, or a combination of these compounds; and simultaneously growing by epitaxy the first semiconductor portions on the third portions and the second semiconductor portions on the fourth portions.

According to an embodiment, the method further comprises the steps of:

forming, on the substrate, a layer of the third material having the fourth polarity; and growing by epitaxy a portion of the third portions having the third polarity in contact with the layer.

According to an embodiment, the third portions are formed by MOCVD at a temperature lower than 1,150° C.

According to an embodiment, the method further comprises the step of:

simultaneously growing by epitaxy the fourth portions having the fourth polarity in contact with the layer and the rest of the third portions having the third polarity.

According to an embodiment, the fourth portions are formed by MOCVD at a temperature higher than 1,200° C.

According to an embodiment, the method further comprises the steps of:

forming, on the substrate, a layer of the third material having the fourth polarity;

etching the layer all the way to the substrate to delimit the fourth portions; and growing by epitaxy the third portions in contact with the substrate.

BRIEF DESCRIPTION OF THE DRAWINGS

The foregoing and other features and advantages will be discussed in detail in the following non-limiting description of dedicated embodiments in connection with the accompanying drawings, among which.

DETAILED DESCRIPTION

Figure 1:
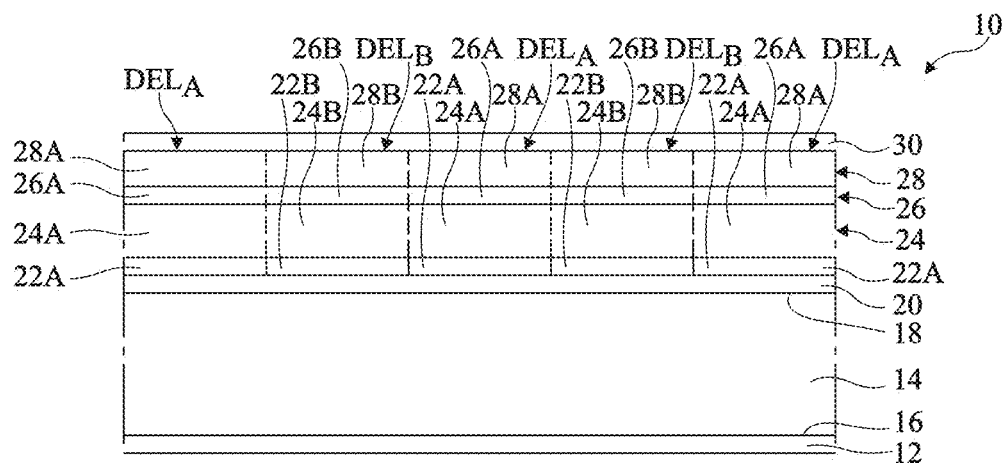
FIG. 1 is a partial simplified cross-section view of an embodiment of an optoelectronic device having a two-dimensional structure with a widened emission spectrum.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the optoelectronic device biasing and control means are well known and will not be described. In the following description, unless otherwise indicated, terms "substantially", "approximately", and "in the order of" mean "to within 10%", preferably to within 5%.

In the following description, saying that a compound made up of at least a first element and a second element has a polarity of the first element and a polarity of the second element means that the material grows along a preferred direction and that when the material is cut in a plane perpendicular to the preferred growth direction, the exposed surface essentially comprises atoms of the first element in the case of the polarity of the first element or atoms of the second element in the case of the polarity of the second element.

The present application particularly relates to optoelectronic devices having a three-dimensional structure comprising three-dimensional elements, for example, microwires, nanowires, conical elements, or frustoconical elements. In particular, a conical or frustoconical element may be a circular conical or frustoconical element or a pyramidal conical or frustoconical element. In the following description, embodiments are particularly described for optoelectronic devices having a three-dimensional structure comprising microwires or nanowires. However, such embodiments may be implemented for three-dimensional elements other than microwires or nanowires, for example, conical or frustoconical three-dimensional elements.

Term "microwire", "nanowire", "conical element", or "frustoconical element" designates a three-dimensional structure having a shape elongated along a preferred direction, having at least two dimensions, called minor dimensions, in the range from 5 nm to 2.5 μm, preferably from 50 nm to 2.5 μm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 μm, preferably in the range from 100 nm to 1 μm, more preferably from 100 nm to 800 nm. In certain embodiments, the height of each microwire or nanowire may be greater than or equal to 500 nm, preferably in the range from 1 μm to 50 μm.

In the following description, term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter.

In the following description, embodiments will be described in the case of an optoelectronic device comprising light-emitting diodes. It should however be clear that these embodiments may concern other applications, particularly devices dedicated to electromagnetic radiation detection or measurement or devices dedicated to photovoltaic applications.

According to an embodiment, the optoelectronic device having a two-dimensional or three-dimensional structure comprises active regions which are formed by epitaxy on semiconductor portions of a same material and which have different polarities. The inventors have shown that the active regions simultaneously formed in the same growth conditions have different emission or reception properties according to the polarity of the semiconductor portions on which they are formed. In particular, active regions capable of emitting or of absorbing an electromagnetic radiation at different wavelengths can be obtained.

FIG. 1 is a partial simplified cross-section view of an embodiment of an optoelectronic device 10 having a two-dimensional structure and capable of emitting an electromagnetic radiation.

Device 10 comprises, from bottom to top in FIG. 1:
a first biasing electrode 12, for example, metallic;
a substrate 14 comprising a first surface 16 in contact with electrode 12 and a second surface 18 opposite to first surface 16;
a seed layer 20 of a first semiconductor material with a first polarity, in contact with surface 18,
first seed portions 22A, in contact with layer 20, of the first semiconductor material with a second polarity different from the first polarity;
second seed portions 22B, in contact with layer 20, of the first material with the first polarity, contiguous to first portions 22A, seed portions 22A and 22B having, in the present embodiment, substantially coplanar upper surfaces;
a semiconductor layer 24 of a second doped semiconductor material of a first conductivity type covering first and second portions 22A, 22B and divided into first semiconductor regions 24A, in contact with first portions 22A and having a first polarity, and into second semiconductor regions 24B, in contact with second portions 22B and contiguous to the first semiconductor regions 24A and having a second polarity different from the first polarity, the upper surfaces of conductive portions 22A, 24B being also substantially coplanar;
an active layer 26 covering semiconductor layer 24 and divided into first active regions 26A in contact with first semiconductor regions 24A and into second active regions 26B, contiguous to the first active regions 26A and in contact with second regions 24B;
a semiconductor layer 28 of the second doped semiconductor material of a second conductivity type opposite to the first conductivity type, covering active layer 26 and divided into third semiconductor regions 28A, in contact with first active regions 26A and having a first polarity, and into fourth semiconductor regions 28B, in contact with second active regions 26B, contiguous to the third semiconductor regions 28A and having a second polarity; and
a second electrode layer 30 covering semiconductor layer 28.

According to another embodiment, the upper surfaces of seed portions 22A and 22B are not coplanar and only the upper surfaces of conductive portions 22A, 24B are substantially coplanar.

Each stack comprising a first active region 26A sandwiched between a first semiconductor region 24A and a third semiconductor region 28A forms a first light-emitting diode $DEL_A$. Each stack comprising a second active region 26B sandwiched between a second semiconductor region 24B and a fourth semiconductor region 28B forms a second light-emitting diode $DEL_B$.

In the present embodiment, light-emitting diodes $DEL_A$, $DEL_B$ are connected in parallel. Optoelectronic device 10 may comprise from one light-emitting diode $DEL_A$ to one thousand light-emitting diodes $DEL_A$ and from one light-emitting diode $DEL_B$ to one thousand light-emitting diodes $DEL_B$.

Figure 2:
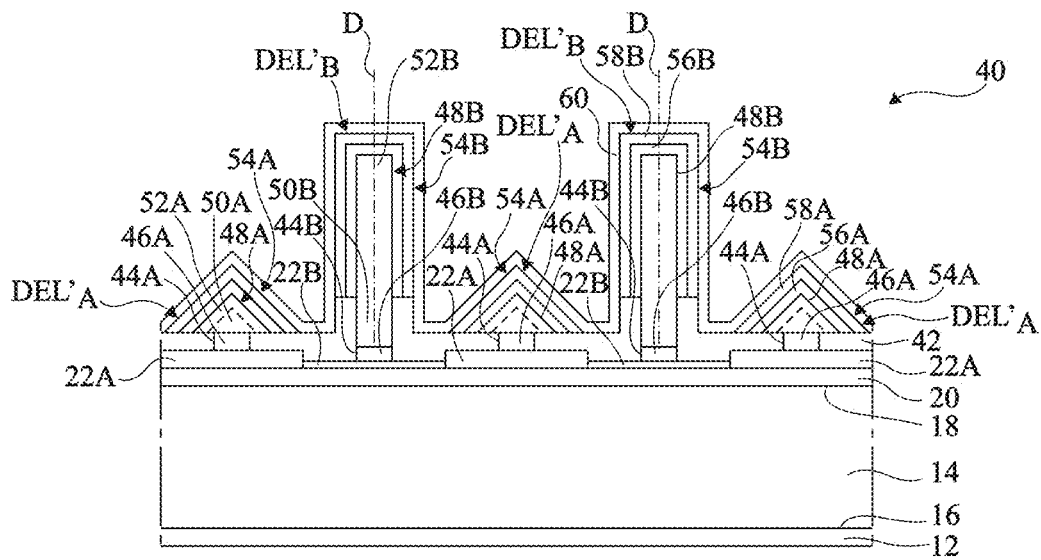
FIG. 2 is a partial simplified cross-section view of an embodiment of an optoelectronic device having a three-dimensional structure with a widened emission spectrum.

FIG. 2 is a partial simplified cross-section view of an embodiment of an optoelectronic device 40 having a three-dimensional structure with wires such as previously described and capable of emitting an electromagnetic radiation.

Device 40 comprises, like optoelectronic device 10 shown in FIG. 1, first electrode 12, substrate 14, layer 20, first portions 22A and second portions 22B, with the difference that second portions 22B may not have the same thickness as first portions 22A.

Device 40 further comprises, from bottom to top in FIG. 2:
an insulating region 42 covering first seed portions 22A and second seed portions 22B and comprising openings 44A, 44B, each opening 44A exposing a portion of one of first seed portions 22A and each opening 44B exposing a portion of one of second seed portions 22B;
first seeds 46A located in openings 44A in contact with first seed portions 22A;
second seeds 46B located in openings 44B in contact with second seed portions 22B;
first semiconductor portions 48A corresponding to first three-dimensional semiconductor elements 48A, which, in the present embodiment, correspond to pyramids, three pyramids 48A being shown, each pyramid 48A comprising an inner portion 50A, doped with a first conductivity type, for example, type N, in contact with one of first seeds 46A, and an outer portion 52A, doped with the first conductivity type or non-intentionally doped, covering inner portion 50A, where each pyramid 48A may, as shown in FIG. 2, rest on insulating region 42, or may only extend on the underlying first seed 46A;
second semiconductor portions 48B corresponding to second three-dimensional semiconductor elements 48B, which, in the present embodiment, correspond to wires of axis D, two wires 48B being shown, each wire 48B comprising a lower portion 50B, doped with a first conductivity type, for example, type N, in contact with one of second seeds 46B, and an upper portion 52B, doped with the first conductivity type or non-intentionally doped, where insulating region 42 may further cover the lateral walls of the lower portion 50B of each wire 48B;

a first shell 54A covering the outer portion 52A of each pyramid 48A, each first shell 54A comprising at least one stack of an active region or layer 56A covering outer portion 52A of pyramid 48A and of a semiconductor layer 58A of a second conductivity type opposite to the first conductivity type, covering active layer 56A;

a second shell 54B covering the upper portion 52B of each wire 48B, each second shell 54B comprising at least a stack of an active layer 56B covering upper portion 52B of wire 48B and of a semiconductor layer 58B of a second conductivity type opposite to the first conductivity type, covering active layer 56B;

a second electrode layer 60 covering semiconductor layers 58A, 58B of the first and second shells 54A, 54B and insulating layer 42.

For optoelectronic device 10, 40, a conductive layer, not shown, may cover electrode layer 60 between wires 48B and pyramids 48A. A transparent insulating encapsulation layer, not shown, may cover electrode layer 60.

The assembly formed by each pyramid 48A and the associated shell 54A forms a first light-emitting diode $DEL'_A$. The assembly formed by each wire 48B and the associated shell 54B forms a second light-emitting diode $DEL'_B$. Optoelectronic device 40 may comprise from one light-emitting diode $DEL_A$ to one thousand light-emitting diodes $DEL'_A$ and from one light-emitting diode $DEL'_B$ to one thousand light-emitting diodes $DEL'_B$. Light-emitting diodes $DEL_A$, $DEL_B$, $DEL'_A$, $DEL'_B$ of optoelectronic device 10 or 40 may be arranged in the form of an array of light-emitting diodes.

Figure 3:
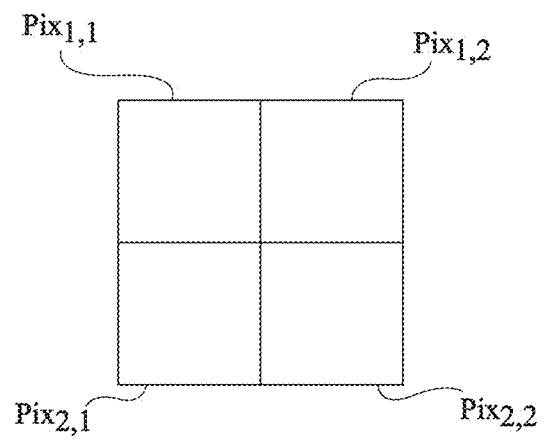
FIG. 3 is a partial simplified top view of the optoelectronic device in FIG. 1 or 2.

FIG. 3 schematically shows an array of N rows and M columns of display pixels $Pix_{i,j}$, where N and M are integers, which are each equal to 2 in FIG. 3, where i is an integer which varies from 1 to N, and j is an integer which varies from 1 to M. In FIG. 3, the rows and the columns are rectilinear. However, the display pixels of a row may be arranged in quincunx with respect to the pixels of adjacent rows. In the case of optoelectronic device 10 shown in FIG. 1, display pixels $Pix_{1,1}$ and $Pix_{2,2}$ may correspond to light-emitting diodes $DEL_A$ and display pixels $Pix_{1,2}$ and $Pix_{2,1}$ may correspond to light-emitting diodes $DEL_B$. In the case of optoelectronic device 40 shown in FIG. 2, display pixels $Pix_{1,1}$ and $Pix_{2,2}$ may correspond to light-emitting diodes $DEL'_A$ and display pixels $Pix_{1,2}$ and $Pix_{2,1}$ may correspond to light-emitting diodes $DEL'_B$.

According to another embodiment, the optoelectronic device may comprise at the same time light-emitting diodes of an electronic device having a two-dimensional structure and light-emitting diodes of an optoelectronic device having a three-dimensional structure. According to another embodiment, display pixel $Pix_{1,1}$ may correspond to a light-emitting diode $DEL_A$ of optoelectronic device 10, display pixel $Pix_{1,2}$ may correspond to a light-emitting diode $DEL'_A$ of optoelectronic device 40, display pixel $Pix_{2,1}$ may correspond to a light-emitting diode $DEL'_B$ of optoelectronic device 40, and display pixel $Pix_{2,2}$ may correspond to a light-emitting diode $DEL'_B$ of optoelectronic device 10.

As a variation, instead of display pixels, the first and second seed portions 22A, 22B may be in the form of strips. The optoelectronic device may comprise both light-emitting diodes of an optoelectronic device having a two-dimensional structure formed on first strips and light-emitting diodes of an optoelectronic device having a three-dimensional structure formed on second strips.

Substrate 14 may be a monoblock structure or may comprise a stack of one layer, of two layers, or of a plurality of layers. Substrate 14 may be a semiconductor substrate, for example, a substrate made of silicon, of germanium, of silicon carbide, of a III-V compound such as GaN or GaAs, or a ZnO substrate. Preferably, substrate 14 is a single-crystal silicon substrate. Preferably, it is a semiconductor substrate compatible with manufacturing methods implemented in microelectronics. Substrate 14 may correspond to a multilayer structure of silicon-on-insulator type, also called SOI. Substrate 14 may be made of an insulating material, for example, sapphire, silicon dioxide ($SiO_2$), or glass. When the structure of substrate 14 does not enable current to flow between surfaces 16 and 18, electrode 12 may be formed on the side of surface 18 of substrate 14. Substrate 14 may be heavily-doped, lightly-doped, or non-doped.

Seed layer 20 and seed portions 22A, 22B are made of a material favoring the growth of semiconductor portions 24A, 24B and of seeds 46A, 46B. As an example, the material forming seed layer 20 and seed portions 22A, 22B may be a nitride, a carbide, or a boride of a transition metal from column IV, V, or VI of the periodic table of elements, or a combination of these compounds. As an example, seed layer 20 and seed portions 22A, 22B may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbonitride (TaCN), of magnesium nitride in $Mg_xN_y$ form, where x is approximately equal to 3 and y is approximately equal to 2, for example, magnesium nitride in $Mg_3N_2$ form. Seed layer 20 for example a thickness in the range from 1 to 300 nanometers, preferably in the range from 10 to 50 nanometers. Each seed portion 22A, 22B for example a thickness in the range from 1 to 500 nanometers, preferably in the range from 10 to 100 nanometers. Seed portions 22A, 22B may have a generally cylindrical shape with its base for example having a polygonal shape, particularly triangular, rectangular, square, or hexagonal.

The material forming seed layer 20 and seed portions 22A, 22B may have a first polarity or a second polarity. According to an embodiment, seed layer 20 and seed portions 22B have the first polarity and seed portions 22A have the second polarity. As an example, when seed layer 20 and seed portions 22A, 22B are made of AlN, seed layer 20 and seed portions 22B may have an N polarity and seed portions 22A may have an Al polarity.

Semiconductor portions 24A, 24B, seeds 46A, 46B, semiconductor elements 48A, 48B, and semiconductor layers 28, 58A, 58B may be mainly formed from at least one semiconductor material selected from the group comprising III-V compounds and II-VI compounds.

Semiconductor portions 24A, 24B, seeds 46A, 46B, semiconductor elements 48A, 48B, and semiconductor layers 28, 58A, 58B may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the compound may be combined with different molar fractions.

Semiconductor portions 24A, 24B, seeds 46A, 46B, semiconductor elements 48A, 48B, and semiconductor layers 28, 58A, 58B may be at least partly made from semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Semiconductor portions 24A, 24B, semiconductor elements 48A, 48B, and semiconductor layers 28, 58A, 58B may further comprise a dopant. As an example, for compounds, the dopant may be selected from the group comprising a P-type group-II dopant, for example, magnesium (Mg), zinc (Zn), cadmium (Cd), or mercury (Hg), a P-type group-IV dopant, for example, carbon (C) or an N-type group-IV dopant, for example, silicon (Si), germanium (Ge), selenium (Se), sulfur (S), terbium (Tb), or tin (Sn).

Semiconductor layer 24 of optoelectronic device 10 may have a thickness which varies from 10 nm to 10 µm, preferably from 100 nm to 2.5 µm.

When the three-dimensional semiconductor elements 48A of optoelectronic device 40 correspond to pyramids, the height of each pyramid may be in the range from 100 nm to some hundred micrometers, preferably from 200 nm to 25 µm. Each pyramid 48A may have a semiconductor structure elongated along an axis substantially perpendicular to surface 18. The base of each pyramid may have a general shape of oval, circular, or polygonal type, particularly triangular, rectangular, square, or hexagonal. The centers of two adjacent pyramids may be distant by from 0.25 µm to 10 µm and, preferably, from 1 µm to 5 µm.

When the three-dimensional semiconductor elements 48B of optoelectronic device 40 correspond to wires, the height of wire 48B may be in the range from 250 nm to 50 µm. Each wire 48B may have a semiconductor structure elongated along an axis D. Axes D of wires 48B may be substantially parallel. Each wire 48B may have a generally cylindrical shape with its base for example having an oval, circular, or polygonal shape, particularly triangular, rectangular, square, or hexagonal. The axes of two adjacent wires 48B may be distant by from 0.5 µm to 10 µm and preferably from 1.5 µm to 5 µm. As an example, wires 48B may be regularly distributed, particularly in a hexagonal network.

According to an embodiment, the lower portion 50B of each wire 48B is predominantly made of a III-N compound, for example, gallium nitride, doped with a first conductivity type, for example, N-type doped. The N-type dopant may be silicon. The height of lower portion 50B may be in the range from 500 nm to 25 µm.

According to an embodiment, upper portion 52B of each wire 48B is for example at least partly made of a III-N compound, for example, gallium nitride. Upper portion 52B may be doped with the first conductivity type, for example, type N, or not be intentionally doped. The height of upper portion 52B may be in the range from 500 nm to 25 µm.

In the case of a wire 48B predominantly made of GaN, the crystal structure of the wire may be of wurtzite type, the wire extending along crystallographic direction C.

Active layer 26, 56A, 56B is the layer from which most of the radiation provided by optoelectronic device 10, 40 is emitted. Active layer 26, 56A, 56B may comprise confinement means. As an example, active layer 26, 56A, 56B may comprise a single quantum well. It may then comprise a semiconductor material having a bandgap smaller than that of the material forming semiconductor layers 24, 28, three-dimensional semiconductor elements 48A, 48B, and semiconductor layers 58A, 58B. Active layer 26, 56A, 56B may comprise multiple quantum wells. It then comprises a stack of semiconductor layers forming an alternation of quantum wells and of barrier layers.

Semiconductor layer 28, 58A, 58B may comprise a stack of a plurality of layers particularly comprising:
- an electron barrier layer covering active layer 26, 56A, 56B;
- an intermediate layer having a conductivity type opposite to that of semiconductor layer 24 or to semiconductor portions 50A, 50B and covering the electron barrier layer; and
- a bonding layer covering the intermediate layer and covered with electrode 30, 60.

The electron barrier layer may be formed of a ternary alloy, for example, aluminum gallium nitride (AlGaN) or aluminum indium nitride (AlInN) in contact with the active layer and the intermediate layer, to provide a good distribution of electric carriers in the active layer.

The intermediate layer, for example, P-type doped, may correspond to a semiconductor layer or to a stack of semiconductor layers and enables to form a P-N or P-I-N junction, active layer 26, 56A, 56B being located between the intermediate P-type layer and N-type semiconductor portion 24A, 50A, 50B of the P-N or P-I-N junction.

The bonding layer may correspond to a semiconductor layer or to a stack of semiconductor layers and enables to form an ohmic contact between the intermediate layer and electrode 30, 60. As an example, the bonding layer may be very heavily doped, with a doping type opposite to that of semiconductor portion 24A, 24B, 50A, 50B, until degeneration of the semiconductor layer(s), for example, P-type doped at a concentration greater than or equal to $10^{20}$ atoms/cm$^3$.

The intermediate layer and/or the bonding layer may be mainly formed from a semiconductor material selected from the group comprising III-V compounds and II-VI compounds.

Insulating region 42 of optoelectronic device 40 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (particularly of general formula SiO$_x$N$_y$, for example, Si$_2$ON$_2$), of hafnium oxide (HfO$_2$), or of diamond. As an example, the thickness of insulating region 42 is in the range from 10 nm to 25 µm. Insulating region 42 may have a monolayer structure or may correspond to a stack of two layers or of more than two layers.

Electrode 30, 60 is capable of biasing active layer 26, 56A, 56B and of giving way to the electromagnetic radiation emitted by light-emitting diodes DEL$_A$, DEL$_B$, DEL'$_A$, DEL'$_B$. The material forming electrode 30, 60 may be a transparent conductive material such as indium tin oxide (or ITO), zinc oxide, doped or not with aluminum or with gallium, or graphene. As an example, electrode layer 30, 60 has a thickness in the range from 5 nm to 200 nm, preferably from 20 nm to 50 nm.

When a voltage is applied between electrodes 12 and 30, 60, a light radiation is emitted by active layer 26, 56A, 56B.

The method of growing seed layer 20, semiconductor layer 24, seeds 46A, three-dimensional semiconductor elements 48A, 48B, active layers 26, 56A, 56B, and/or semiconductor layers 28, 58A, 58B may be a method such as chemical vapor deposition (CVD) or metal-organic chemical vapor deposition (MOCVD), also known as metal-organic vapor phase epitaxy (MOVPE). However, methods such as molecular beam epitaxy (MBE), gas-source MBE (GSMBE), metal-organic MBE (MOMBE), plasma-assisted MBE (PAMBE), atomic layer epitaxy (ALE), hydride vapor phase epitaxy (HYPE), or an atomic layer deposition (ALD), may be used. Further, methods of physical vapor deposition (PVD) or of chemical vapor deposition may he used, for example, chemical bath deposition (CBD), hydrothermal methods, liquid-feed flame spray pyrolysis, electrodeposition, or cathode sputtering.

Seed portions 22A, 22B may be grown by a method of CVD, MOCVD, MBE, GSMBE, MOMBE, PAMBE, ALE, HVPE, PVD or ALD type.

As an example, in the case of semiconductor layer 24, of seeds 46A, 46B, and/or of three-dimensional semiconductor elements 48A, 48B, the seed-forming method may comprise injecting into a reactor a precursor of a group-III element and a precursor of a group-V element. Examples of group-III precursors are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH). Call V/III the ratio of the gas flow of the precursor of the group-V element to the gas flow of the precursor of the group-III element.

According to an embodiment of the invention, in a phase of growth of semiconductor layer 24 and/or of the three-dimensional semiconductor elements 48A, 48B of the III-V compound, particularly for the growth of portion 50A, 50B, a precursor of a further element is added, in addition to the precursors of the compound. The presence of the precursor of the further element results in the incorporation of the further element into the III-V compound to dope this compound. In the case of lower portion 50B of wire 48B, this further results in the forming of a layer of a dielectric material predominantly made of the further element and of the group-V element on the lateral sides of the growing crystals of the III-V compound. The further element may be silicon (Si). An example of a precursor of silicon is silane ($SiH_4$). This enables to dope the N-type wires. This may further cause the forming of a dielectric layer of silicon nitride SiN, possibly in stoichiometric form $Si_3N_4$, on the lateral walls of the wire. The thickness of the obtained $Si_3N_4$ dielectric layer is then generally smaller than 10 nm.

Optoelectronic device 10, 40 is formed so that the polarity of semiconductor portions 24A, 52A is different from the polarity of semiconductor portions 24B, 52B. Thereby, the polarity of active regions 26A, 56A is different from the polarity of active regions 26B, 56B. The wavelength of the electromagnetic radiation emitted or received by the optoelectronic device particularly depends on the bandgap of the material forming the quantum well(s). When the material is an alloy of the III-V or II-VI compound and of a third element, the wavelength of the emitted or received radiation particularly depends on the atomic percentage of the third element, for example, indium. In particular, the greater the atomic percentage of indium, the greater the wavelength.

In the case where the active layers are formed by epitaxy and comprise a third element, the incorporation of the third element particularly depends on the polarity of the active layer. As a result, the proportion of the third element is different between active regions 26A, 56A, and active regions 26B, 56B. As a result, the emission wavelengths linked to active regions 26A, 56A are different from those of active regions 26B, 56B. The optoelectronic device 10 shown in FIG. 1 and the optoelectronic device 40 shown in FIG. 2 are capable of emitting a light radiation having at least two different wavelengths. A device having wideband emission or reception properties can thus be obtained. In particular, the obtained emission or reception spectrum may be characteristic of white light. As compared with an optoelectronic device comprising microwires or nanowires emitting blue light and a layer comprising phosphors absorbing part of the blue light and emitting yellow light, so that the general emission spectrum of the optoelectronic device is close to that of white light, the optoelectronic device according to the present embodiment requires no phosphor layer to provide white light.

Further, for the optoelectronic device 40 shown in FIG. 2, active layers 56A, 56B comprise a succession of regions having different thicknesses or contents of materials. Particularly, in the case where active layer 56A, 56B comprises at least one InGaN layer, the indium content is modified when the deposition is performed on structures with straight sides or on structures with inclined sides. Further, the thicknesses of the InGaN and GaN layers are different when these layers are formed on structures with straight sides or on structures with inclined sides. Indeed, the growth speed, on structures having inclined sides, of the layers forming the quantum wells, as well as the incorporation of indium into these same wells, is different according to the different diameters of the regions of constant cross-section and to the different inclinations of the regions with inclined sides.

Further, when the optoelectronic device comprises both light-emitting diodes of an optoelectronic device having a two-dimensional structure and light-emitting diodes of an optoelectronic device having a three-dimensional structure, a light radiation having more than two different wavelengths may be obtained. A device having wideband emission or reception properties can thus be obtained. In particular, the obtained emission or reception spectrum may be characteristic of white light.

The method of depositing seed layer 20 is capable of growing seed layer 20 according to a first polarity. Seed portions 22A are, at least partly, formed by epitaxy on seed layer 20 according to a method capable of changing the polarity of seed portions 22A with respect to seed layer 20. According to an embodiment, the method is a low-temperature MOCVD method. Seed portions 22B are, at least partly, formed by epitaxy on seed layer 20 according to a method capable of not changing the polarity of seed portions 22B with respect to seed layer 20. According to an embodiment, the method is a high-temperature MOCVD method.

FIGS. 4A to 4E are partial simplified cross-section views of the structures obtained at successive steps of another embodiment of a method of manufacturing the optoelectronic device 10 shown in FIG. 1.

Figure 4A:
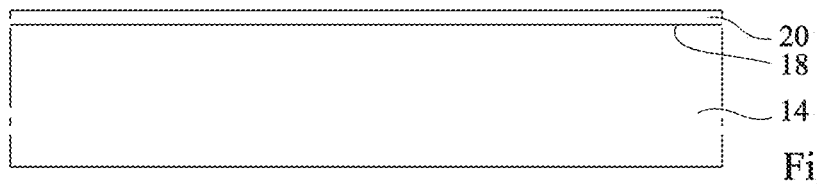
FIGS. 4A to 4E are partial simplified cross-section views of the structures obtained at successive steps of another embodiment of a method of manufacturing the optoelectronic device of FIG. 1.

FIG. 4A shows the structure obtained after having deposited seed layer 20 on surface 18 of substrate 14. As an example, seed layer 20 is made of AlN of polarity N. Seed layer 20 may be deposited by reactive PVD.

Figure 4B:
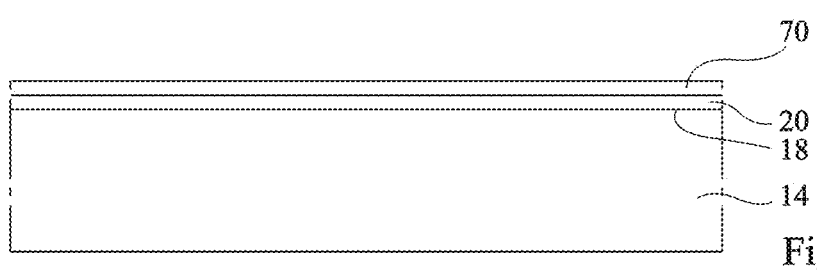

FIG. 4B shows the structure obtained after having deposited by epitaxy a seed layer 70 of the same material as seed layer 20, having a polarity different from the polarity of seed layer 20. A MOCVD-type method may be implemented by injection into a showerhead-type MOCVD reactor, of aluminum precursor gases and of a nitrogen precursor gas. As an example, a showerhead-type 3×2" MOCVD reactor commercialized by AIXTRON, may be used. When seed layer 20 is made of AlN of polarity N, seed layer 70 may be formed by MOCVD at a temperature smaller than 1,150° C. Layer 70 then has an Al polarity.

Figure 4C:
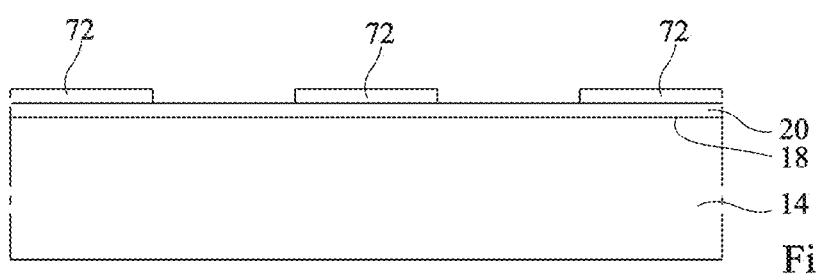

FIG. 4C shows the structure obtained after having etched layer 70 to form portions 72 of Al polarity at the locations desired for seed portions 22A. A wet or dry chemical or physical etching may be implemented.

Figure 4D:
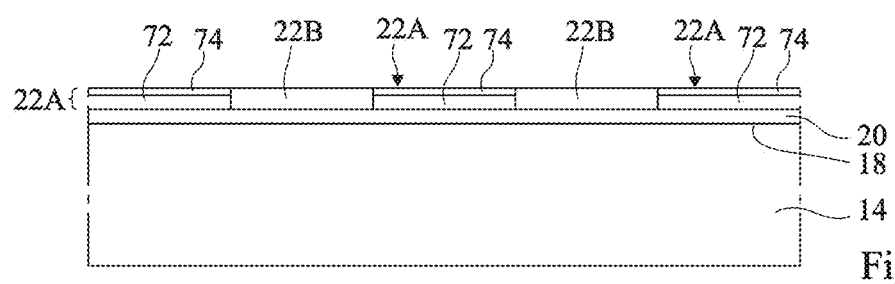

FIG. 4D shows the structure obtained after having simultaneously formed by epitaxy a portion 74 on each portion 72 and seed portions 22B on the portions of seed layer 20 which are not covered with portions 72. Portions 74 are made of the same material and have the same polarity as portions 72. Seed portions 22B are made of the same material and have the same polarity as seed layer 20. The stack of seed portions 72, 74, forms previously-described seed portion 22A. Seed portions 74 and 22B may be formed by MOCVD at a temperature greater than 1,200° C. In the present embodiment, the upper surfaces of portions 74 are substantially coplanar with the upper surfaces of seed portions 22B. This is made possible due to the fact that the growth speed of AlN of N polarity and the growth speed of AlN of Al polarity are different in such growth conditions. According to another embodiment, the upper surfaces of portions 74 and of portions 22B may be non-coplanar. The thicknesses of semiconductor portions 24A and 24B respectively resting on portions 74 and 22B may then be adjusted, particularly by different growth speeds for GaN of polarity Ga and GaN of N polarity, so that the upper surfaces of semiconductor portions 24A and 24B are substantially coplanar. This enables to form an active layer 26 having a two-dimensional structure.

Figure 4E:
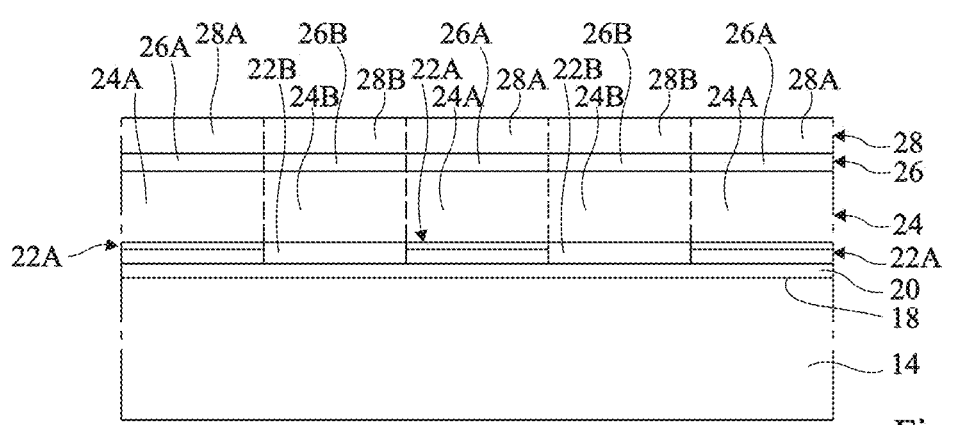

FIG. 4E shows the structure obtained after having formed semiconductor layer 24, active layer 26, and semiconductor layer 28, for example by MOCVD in growth conditions such that the polarity of semiconductor portions 24A, 24B follows that of underlying seed portions 22A, 22B. In the embodiment according to which semiconductor layer 24 is made of GaN, portions 24A of layer 24 have a Ga polarity and portions 24B of layer 24 have an N polarity. In the embodiment according to which active layer 26 comprises at least one InGaN layer, a precursor of indium may be provided in the reactor in addition to the precursors of gallium and of nitrogen. In same growth conditions, the indium incorporation rate in the InGaN layer varies according to the Ga or N polarity of this layer. The emission wavelength of region 26A of active layer 26 is thus different from the emission wavelength of region 26B of active layer 26.

The next steps of the method particularly comprise the forming of electrodes 30 and 12.

FIGS. 5A to 5F are partial simplified cross-section views of the structures obtained at successive steps of another embodiment of a method of manufacturing the optoelectronic device 40 shown in FIG. 2.

Figure 5A:
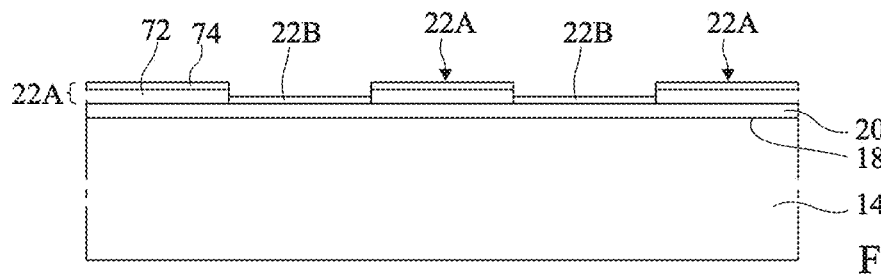
FIGS. 5A to 5F are partial simplified cross-section views of the structures obtained at successive steps of another embodiment of a method of manufacturing the optoelectronic device of FIG. 2.

The method comprises the steps previously described in relation with FIGS. 4A to 4D, with the difference that the thickness of seed portion 22B may be different from the thickness of seed portion 22A, as illustrated in FIG. 5A.

Figure 5B:
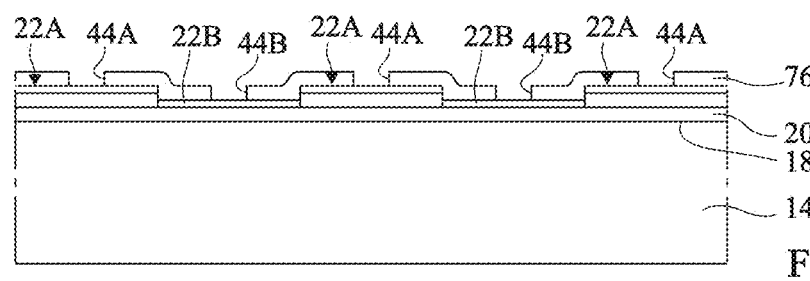

FIG. 5B shows the structure obtained after having formed an insulating layer 76 on seed portions 22A, 22B, and after having etched openings 44A, 44B in insulating layer 76 to expose portions of seed portions 22A, 22B at the locations where seeds 46A, 46B are desired to be formed.

Figure 5C:
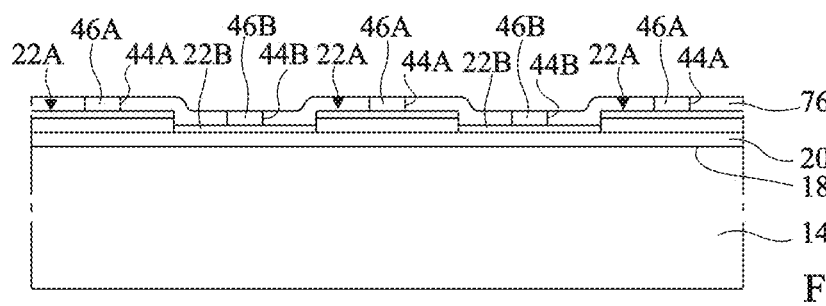

FIG. 5C shows the structure obtained after the forming of seeds 46A, 46B in openings 44A, 44B. As an example, in the case where seeds 46A, 46B are made of GaN, a MOCVD-type method may be implemented by injecting into a MOCVD reactor a gallium precursor gas, for example, trimethylgallium (TMGa), and a nitrogen precursor gas, for example, ammonia ($NH_3$). A V/III ratio in the range from 10 to 10,000 enables to favor the growth of seeds 46A, 46B. The pressure in the reactor is for example in the range from 100 hPa to 800 hPa. The temperature in the reactor is for example in the range from 800° C. to 1,100° C. Seeds 46A, formed on portions 22A of Al polarity, have a Ga polarity. Seeds 46B, formed on portions 22B of N polarity, have an N polarity.

Figure 5D:
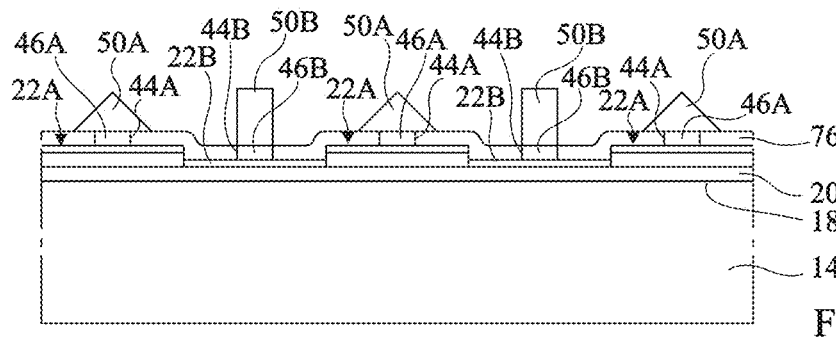

FIG. 5D shows the structure obtained after having grown inner portions 50A of pyramids 48A on seeds 46A and lower portions 50B of wires 48B on seeds 46B. According to an embodiment, the V/III ratio is for example in the range from 10 to 200. The pressure in the reactor is for example in the range from 100 hPa to 800 hPa. The temperature in the reactor is for example in the range from 900° C. to 1,100° C. In such conditions, wires 48B of N polarity grow on seeds 46B of N polarity and pyramids 48A of Ga polarity grow on seeds 46A of Ga polarity.

Further, a precursor of silicon, for example, silane ($SiH_4$), is added to the other precursor gases. The presence of silane among the precursor gases causes the incorporation of silicon within the GaN compound. N-type doped inner portions 50A and lower portions 50B are thus obtained. This may further result in the forming of a silicon nitride layer, not shown, which covers the periphery of each lower portion 50B except for the top, as lower portion 50B grows. In the present embodiment, the growth conditions are selected so that the silicon nitride layer does not form on inner portions 50A of pyramids 48A.

Figure 5E:
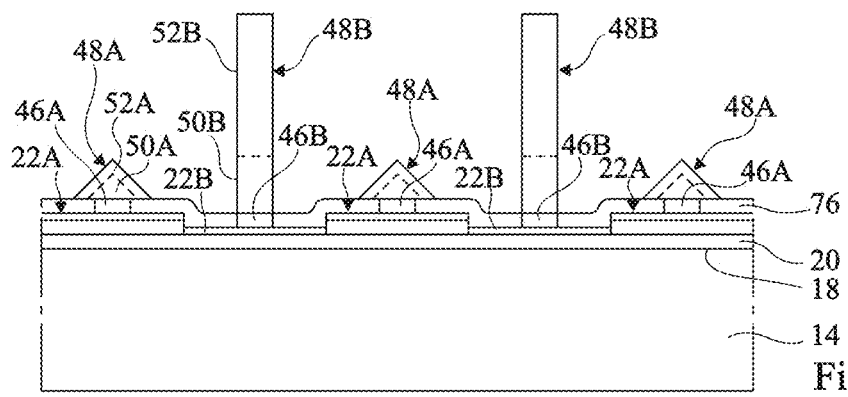

FIG. 5E shows the structure obtained after having grown outer portions 52A of the pyramids and upper portions 52B of wires 48B. According to an embodiment, the previously-described operating conditions of the MOCVD reactor are, as an example, maintained, but for the fact that the silane flow in the reactor is decreased, for example, by a factor greater than or equal to 10, or stopped. Even when the silane flow is stopped, outer portion 52A and upper portion 52B may be N-type doped due to the diffusion in these dopant portions of dopants originating from the portions 50A, 50B or due to the residual doping of the GaN.

Figure 5F:
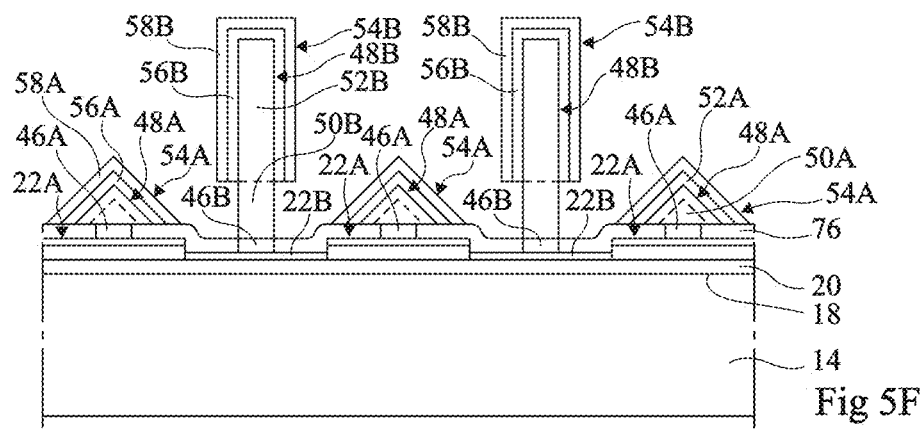

FIG. 5F shows the structure obtained after having simultaneously grown shells 54A covering external portions 52A of pyramids 48A and shells 54B covering upper portions 52B of wires 48B. The layers forming shell 54A, 54B may be formed by MOCVD epitaxy. Given the possible presence of the silicon nitride layer covering the periphery of the lower portion 50B of each wire 48B, the deposition of the layers forming shell 54B only occurs on the upper portion 52B of each wire 48B. Other methods may be used to enable wells to grow all along the wires by depositing a layer at low temperature.

In the embodiment according to which each active layer 56A, 56B comprises one or more than one InGaN layer(s), a precursor of indium may be provided in the reactor in addition to the precursors of gallium and of nitrogen. In same growth conditions, the indium incorporation rate in the InGaN layer varies according to the Ga or N polarity of this layer and according to the crystallographic orientation of the surface having active layer 56A, 56B formed thereon.

The next steps of the method particularly comprise the forming of electrodes 60 and 12.

FIGS. 6A to 6D are partial simplified cross-section views of the structures obtained at successive steps of another embodiment of a method of manufacturing an optoelectronic device having the same structure as optoelectronic device 40 shown in FIG. 2, with the difference that seeds 46A, 46B are not formed in openings of an insulating layer.

The method comprises the steps previously described in relation with FIGS. 4A to 4D, with the difference that the thickness of seed portion 22B may be different front the thickness of seed portion 22A.

Figure 6A:
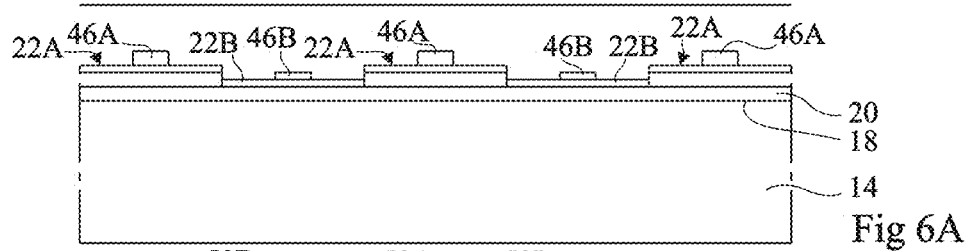
FIGS. 6A to 6D are partial simplified cross-section views of the structures obtained at successive steps of another embodiment of a method of manufacturing the optoelectronic device of FIG. 2.

FIG. 6A shows the structure obtained after the forming of seeds 46A, 46B on seed portions 22A and 22B. The number of seeds 46A, 46B which may form on seed portions 22A and 22B depends on the dimensions of seed portions 22A and 22B. Preferably, the dimensions of seed portions 22A and 22B may be sufficiently small to favor the growth of a single seed 46A, 46B on each seed portion 22A and 22B. As an example, in the case where seeds 46A, 46B are made of GaN, a MOCVD-type method may be implemented by injecting into a showerhead-type MOCVD reactor a gallium precursor gas, for example, trimethylgallium (TMGa), and a nitrogen precursor gas, for example, ammonia ($NH_3$). As an example, a showerhead-type 3×2" MOCVD reactor commercialized by AIXTRON, may be used. A V/III ratio in the range front 10 to 10,000 enables to favor the growth of seeds 46A, 46B. The pressure in the reactor is for example in the range from 100 hPa to 800 hPa. The temperature in the reactor is for example in the range from 800° C. to 1,100° C.

Figure 6B:
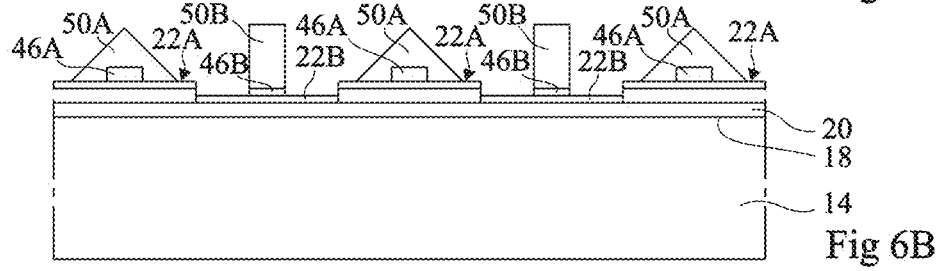

FIG. 6B shows the structure obtained after having grown inner portions 50A of pyramids 48A and lower portions 50B of wires 48B on seeds 46A, as previously described in relation with FIG. 5D.

Figure 6C:
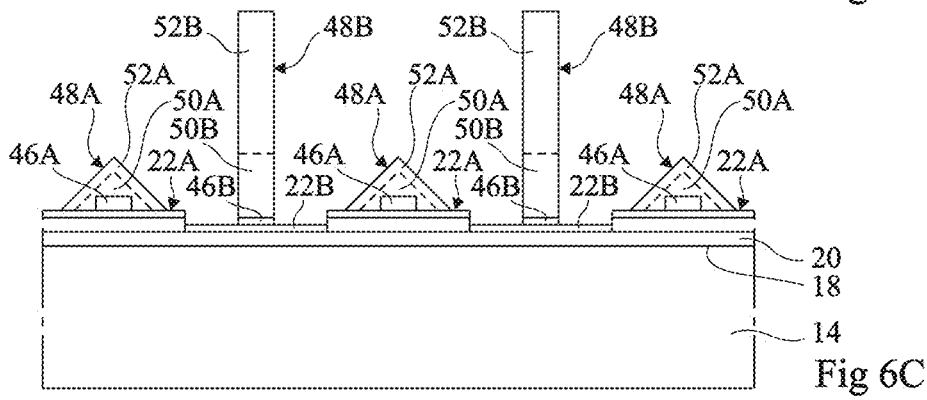

FIG. 6C shows the structure obtained after having grown outer portions 52A of pyramids 48A and upper portions 52B of wires 48B, as previously described in relation with FIG. 5E.

Figure 6D:
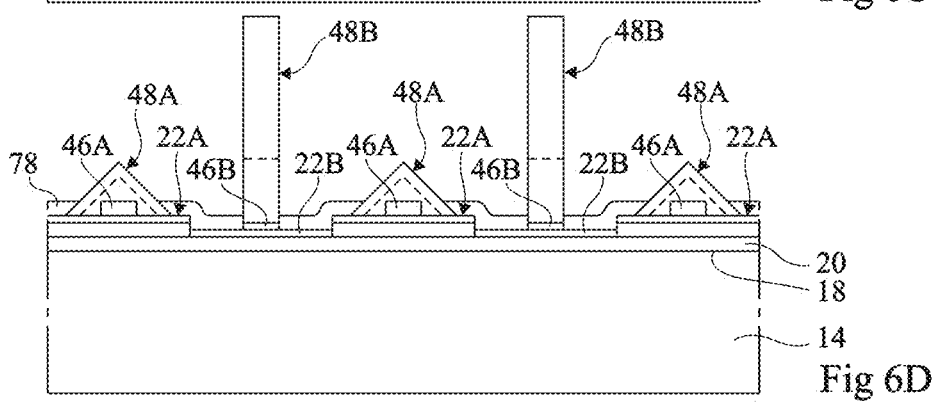

FIG. 6D shows the structure obtained after having deposited an insulating layer 78 all over the structure shown in FIG. 6C and after having etched insulating layer 78 to only keep layer 78 around the base of pyramids 48A and the feet of wires 48B.

The next steps of the method comprise, in particular, growing shells 54A, 54B, as previously described in relation with FIG. 5F, and forming electrodes 60 and 12.

Figure 7:
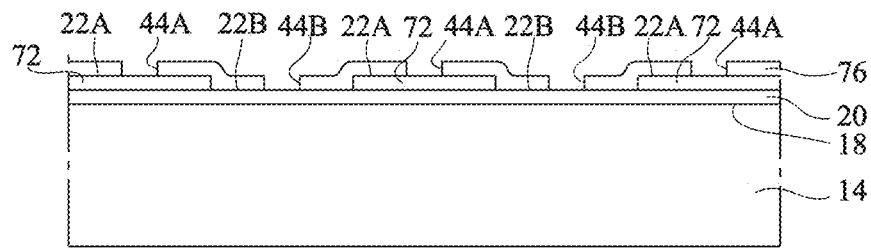
FIG. 7 is a partial simplified cross-section view of the structure obtained at a step of another embodiment of a method of manufacturing the optoelectronic device of FIG. 2.

FIG. 7 is a partial simplified cross-section view of the structure obtained at a step of another embodiment of a method of manufacturing an optoelectronic device having the same structure as optoelectronic device 40 shown in FIG. 2. The method according to the present embodiment is identical to the embodiment previously described in relation with FIGS. 5A to 5F, with the difference that the step of growing portions 74 and 22B by epitaxy, previously described in relation with FIG. 5A, is not present and that insulating layer 76 is directly formed on portions 72 rather than on layer 20. In this embodiment, seed portions 22B then correspond to the portions of layer 20 which are not covered with portions 72 and seed portions 22A correspond to portions 72. Advantageously, the present embodiment comprises one less epitaxy growth step than the embodiment previously described in relation with FIGS. 5A to 5F. Similarly, the manufacturing method according to the embodiment previously described in relation with FIGS. 6A and 6B may be implemented by directly forming seeds 46A on portions 72 and seeds 46B on seed layer 20.

FIGS. 8A to 8D are partial simplified cross-section views of structures obtained at successive steps of another embodiment of a method of manufacturing optoelectronic device 10 shown in FIG. 1 or optoelectronic device 40 shown in FIG. 2. The method comprises the step previously described in relation with FIG. 4A.

Figure 8A:
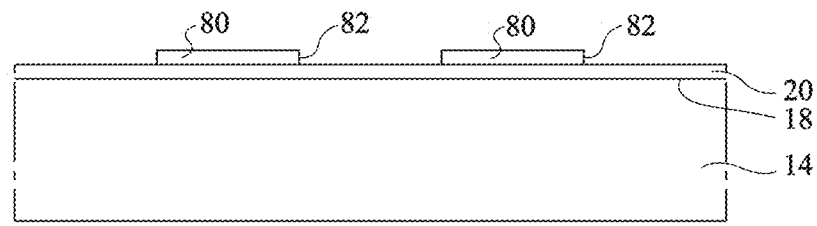
FIGS. 8A to 8D are partial simplified cross-section views of the structures obtained at successive steps of another embodiment of a method of manufacturing the optoelectronic device of FIG. 1 or 2.

FIG. 8A shows the structure obtained after the steps of:
depositing an insulating layer 80 on layer 20; and
etching openings 82 in insulating layer 80 to expose portions of seed layer 20 at the locations where seed portions 22B are desired to be formed.

Figure 8B:
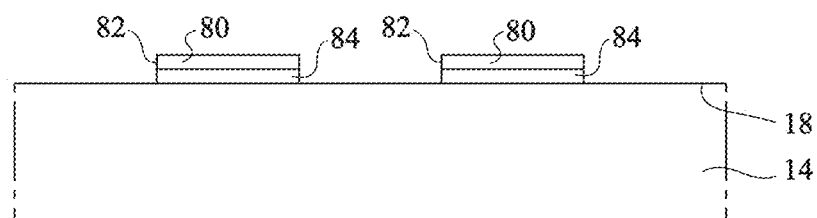

FIG. 8B shows the structure obtained after the etching of layer 20 through openings 82 all the way to substrate 14 to delimit seed portions 84 in layer 20.

Figure 8C:
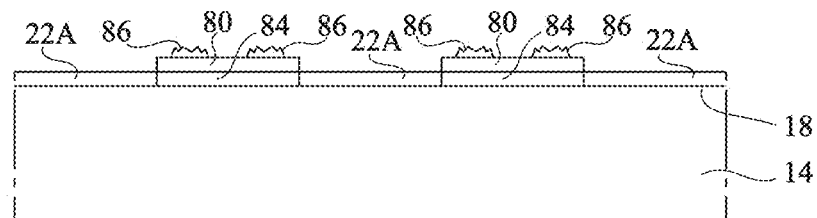

FIG. 8C shows the structure obtained after an epitaxy growth step which has caused the forming of seed portions 22A on the portions of substrate 14 which are not covered with portions 84. The growth conditions may be the same as those previously described in relation with FIG. 4D. The inventors have shown that the polarity of the portions 22A, which grow on substrate 14 is opposite to that of portions 84. In the case of the forming of an optoelectronic device 10 having a two-dimensional structure, the growth of portions 22A is carried on until the upper surfaces of portions 22A are substantially coplanar with the upper surfaces of seed portions 84. Preferably, the material forming insulating layer 80 does not favor the growth of the material forming seed portions 22A. Certain seeds 86 may however form on layer 80.

Figure 8D:
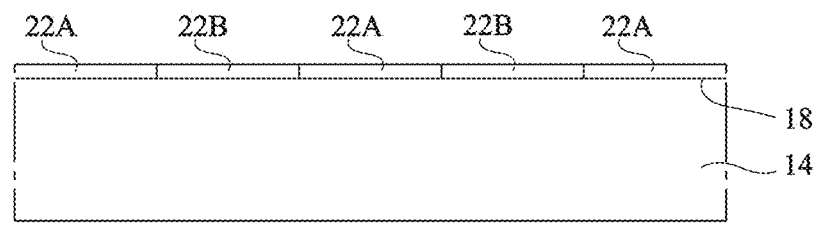

FIG. 8D shows the structure obtained after a step of etching insulating layer 80 to expose seed portions 84. Seed portions 84 then correspond to previously-described seed portions 22B.

The next steps of the method may comprise the steps previously described in relation with FIG. 4E in the case of the forming of an optoelectronic device having a two-dimensional structure, or the steps previously described in relation with FIGS. 5B to 5F or in relation with FIGS. 6A to 6D in the case of the forming of an optoelectronic device having a three-dimensional structure.

Figure 9A:
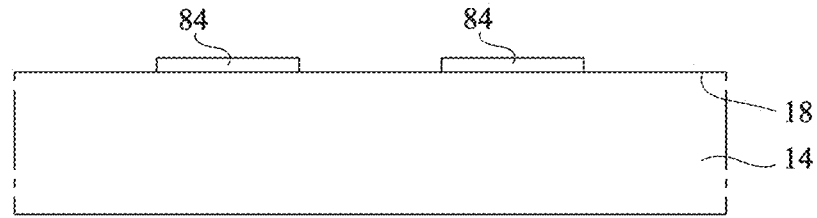
FIGS. 9A and 9B are partial amplified cross-section views of the structures obtained at successive steps of another embodiment of a method of manufacturing the optoelectronic device of FIG. 1 or 2.
Figure 9B:
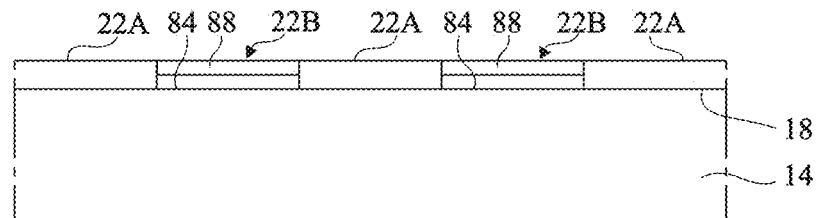

FIGS. 9A and 9B are partial simplified cross-section views of the structures obtained at successive steps of another embodiment of a method of manufacturing the optoelectronic device 10 shown in FIG. 1 or the optoelectronic device 40 shown in FIG. 2. The method comprises the steps previously described in relation with FIGS. 8A and 8B.

FIG. 9A shows the structure obtained after the removal of insulating layer 80 to expose seed portions 84.

FIG. 9B shows the structure obtained after an epitaxy growth step which has caused the forming of seed portions 22A on the portions of substrate 14 which are not covered with portions 22B and the forming of seed portions 88 on portions 84. The growth conditions may be the same as those previously described in relation with FIG. 4D. The inventors have shown that the polarity of the portions 22A which grow on substrate 14 is opposite to that of portions 84 while the polarity of portions 88 which grow on portions 84 have the same polarity as portions 84. The assembly formed by portion 88 and underlying portion 84 then forms seed portion 22B. This is made possible due to the fact that the growth speed of AlN of N polarity and the growth speed of AlN of Al polarity may be made different according to the growth conditions.

An embodiment of a method of manufacturing an optoelectronic device comprising light-emitting diodes $DEL_A$, $DEL_B$ and light-emitting diodes $DEL'_A$, $DEL'_B$ may comprise steps of forming three-dimensional semiconductor elements 48A, 48B before or after the steps of forming semiconductor portions 24A, 24B. The method further comprises a step of depositing an insulating layer on the lateral sides of semiconductor portions 24A, 24B, which then correspond to different blocks. Active layers 56A, 56B, 26A, 26B may then be simultaneously formed and semiconductor layer 58A, 58B, 28A, 28B may be simultaneously formed.

Specific embodiments have been described. A variety of variations and modifications will occur to those skilled in the art. In particular, the ratio of the number of light-emitting diodes $DEL_A$, $DEL'_A$ to the number of light-emitting diodes $DEL_B$, $DEL'_B$ is selected according to the desired emission spectrum of optoelectronic device 10, 40. Similarly, the density of the pyramids or of the wires may be selected and modified to obtain different In concentrations of the active layers and thus obtain additional wavelengths, which enable, among others, to form white.

The invention claimed is:

1. A method of manufacturing an optoelectronic device comprising forming first and second active regions capable of emitting or receiving an electromagnetic radiation made of at least one first semiconductor material mainly comprising a first compound selected from III-V compounds, II-VI compounds, and mixtures thereof, the first active regions having a first polarity and the second active regions having a second polarity different from the first polarity, wherein the method comprises the steps of:
forming, on a substrate, third portions of a third semiconductor material having a third polarity and fourth portions of the third semiconductor material having a fourth polarity different from the third polarity, the third material being a nitride, a carbide, or a boride of a transition metal of column IV, V, or VI, or a combination of these compounds;

forming on the third portions first semiconductor portions of a second semiconductor material mainly comprising the first compound and having the first polarity and, on the fourth portions, second semiconductor portions of the second semiconductor material having the second polarity; and growing by simultaneous epitaxy the first active regions in contact with the first semiconductor portions and the second active regions in contact with the second semiconductor portions.

2. The method of claim 1, further comprising the steps of:
forming, on the substrate, a layer of the third material having the fourth polarity; and
growing by epitaxy a portion of the third portions having the third polarity in contact with the layer.

3. The method of claim 2, wherein the third portions are formed by MOCVD at a temperature lower than 1,150° C.

4. The method of claim 3, further comprising the step of:
growing by epitaxy simultaneously the fourth portion having the fourth polarity in contact with the layer and the rest of the third portions having the third polarity.

5. The method of claim 2, further comprising the step of:
growing by epitaxy simultaneously the fourth portion having the fourth polarity in contact with the layer and the rest of the third portions having the third polarity.

6. The method of claim 5, wherein the fourth portions are formed by MOCVD at a temperature higher than 1,200° C.

7. The method of claim 1, further comprising the steps of:
forming, on the substrate, a layer of the third material having the fourth polarity;
etching the layer all the way to the substrate to delimit the fourth portions; and
growing by epitaxy the third portions in contact with the substrate.

8. The method of claim 1, wherein the first active regions are capable of emitting or of receiving a first electromagnetic radiation at a first wavelength and wherein the second active regions are capable of emitting or of receiving a second electromagnetic radiation at a second wavelength different from the first wavelength.

9. The method of claim 1, wherein the first polarity corresponds to the polarity of the group-III or -II element and wherein the second polarity corresponds to the polarity of the group-V or -VI element.

10. The method of claim 1, wherein the first semiconductor material comprises a further element in addition to the first compound.

11. The method of claim 1, wherein the first semiconductor portions have the shape of pyramids and wherein the second semiconductor portions comprise microwires or nanowires.

* * * * *